United States Patent [19]

Massa

[11] 4,123,567

[45] Oct. 31, 1978

[54] PROCESS FOR APPLYING ELECTRODES TO THE SURFACES OF ELECTROACOUSTIC TRANSDUCER ELEMENTS SUCH AS CERAMIC DISCS

[75] Inventor: Frank Massa, Cohasset, Mass.

[73] Assignee: Donald P. Massa & Fred M. Dellorfano, Jr. Trustees of The Stonleigh Trust u/d/t, Cohasset, Mass.

[21] Appl. No.: 800,710

[22] Filed: May 26, 1977

[51] Int. Cl.$^2$ ............................ B05D 5/12; B05D 3/12
[52] U.S. Cl. ..................................... 427/123; 427/58; 427/100; 427/264; 427/277; 427/305
[58] Field of Search ................ 427/123, 58, 100, 277, 427/264, 367, 305; 118/102, 106; 84/DIG. 24

[56] References Cited

U.S. PATENT DOCUMENTS

| 2,887,985 | 5/1959 | Way ........................................ 118/106 |
| 3,106,858 | 10/1963 | Ward ....................................... 118/102 |
| 3,265,520 | 8/1966 | Obenshain ............................... 427/277 |
| 3,676,213 | 7/1972 | Marton ................................... 427/264 |

Primary Examiner—Michael F. Esposito

[57] ABSTRACT

This invention discloses an improved process for applying electrodes to the surfaces of thin ceramic discs which permits the coating of the entire disc with a conducting film and then automatically removes the conducting film from the peripheral edge of the disc as it is rolling down an inclined plane while being held within a guide slot. The bottom of the guide slot is provided with a moving abrasive belt which automatically removes the conducting film from the peripheral edge of the disc as it passes over the belt. The inventive process will permit the advantageous use of plated electrodes such as electroless nickel without entailing the costly expense of masking the edges of the discs before plating.

5 Claims, 3 Drawing Figures

PROCESS FOR APPLYING ELECTRODES TO THE SURFACES OF ELECTROACOUSTIC TRANSDUCER ELEMENTS SUCH AS CERAMIC DISCS

This invention is concerned with an improved process for applying electrode surfaces to electroacoustic transducer elements such as piezoelectric ceramic discs. The conventional method for attaching electrodes to the surfaces of ceramic elements consists in applying a thin film of metallic "paint," such as a suspension of silver particles in a liquid base, to the ceramic surfaces. The liquid is applied by a convenient method, such as spraying, brushing, or silk screen, and after coating, the ceramic elements are fired to cause the liquid to be removed and the coating is reduced to metallic silver. The process is relatively expensive and has the additional disadvantage that the silver film does not make a uniformally good bond with the ceramic, especially the lead-zirconate-titanate ceramics. A recent attempt to improve this condition has been the utilization of the electroless nickel-plating process which chemically deposits nickel over the ceramic surface and achieves greatly improved electrode integrity.

One of the difficulties encountered in the use of the electroless nickel process with relatively small ceramic discs is that it becomes very expensive and impractical to mask the edges of the thin discs to prevent the plating of the edge which would short-circuit the element. For relatively large-size discs, it is economically feasible to mask the edge surface before plating or, alternatively, the nickel may be deposited over the entire ceramic surface and then removed from the edge by a centerless grinding operation. For small discs of very low value, it is not economical to grind the edges of the discs and, therefore, the improved nickel-plated electrodes have not been generally utilized in the large market for low-cost small ceramic discs.

The primary object of this invention is to improve the process for applying electrode surfaces to piezoelectric elements.

Another object of this invention is to improve the process for applying electrodes to the faces of a thin small disc and eliminate the necessity for masking the edge of the disc.

A still further object of the invention is to improve the process for utilizing a plating procedure to metallically coat a ceramic over its entire surface and then remove the undesired coating from the edges by an inexpensive automatic method.

The novel features which are characteristic of the invention are set forth with particularity in the appended claims.

However, the invention itself, both as to its organization and method of operation, together with further objects and advantages thereof, will best be understood by reference to the following description when taken in conjunction with the accompanying drawings in which.

Figure 1:
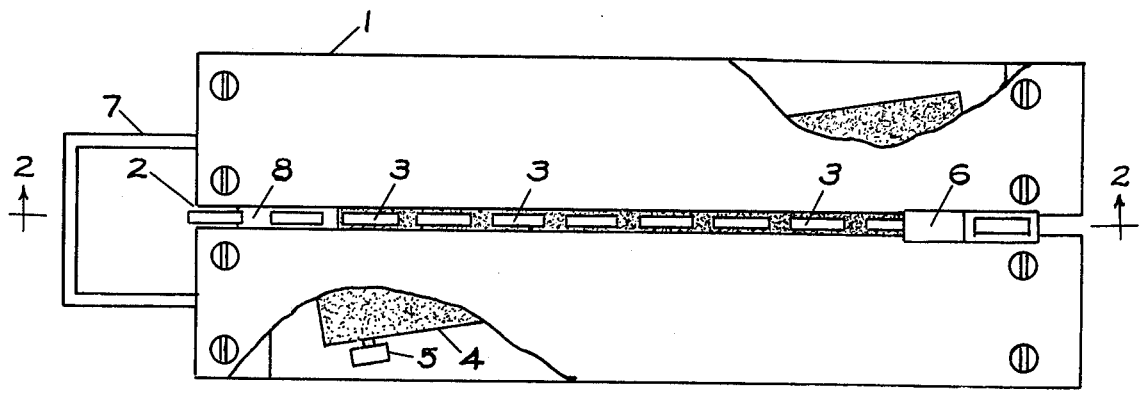
FIG. 1 is a schematic plan view illustrating a preferred embodiment of my invention.
Figure 2:
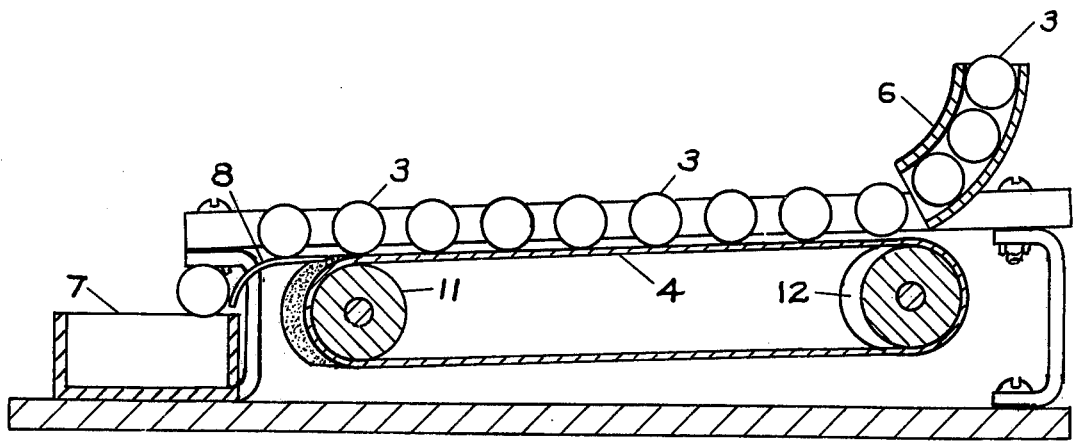
FIG. 2 is a cross-sectional view taken along the line 2—2 of FIG. 1.

Referring more particularly to the figures, the reference character 1 illustrates a table-top surface containing a longitudinal slot 2 along its length which provides clearance for the thickness of the ceramic discs 3. Beneath the table-top is mounted a conventional endless abrasive belt 4 which is driven over the rollers 11 and 12 by an electric motor 5 in the conventional manner, as is well known in the art. A chute 6 is mounted over the slot 2 at one end of the assembly and provides a guide for permitting the ceramic discs to be fed into the longitudinal slot 2, as illustrated. A hopper with conventional sorting means for feeding the ceramics into the chute 6 may be provided above the chute 6, if desired, to contain a quantity of ceramic discs which are to be processed for the automatic removal of the edge coating of conducting film. The hopper, which is not shown in the drawings, may be any one of the numerous conventionally available structures which are suitable for feeding the ceramic discs into the guide slot 2 in a continuous stream. At the opposite end of the table is a container 7 which collects the ceramics at the end of the process as they roll off the support plate 8. The surface of the abrasive belt 4 is inclined so that the highest point is at the end nearest the chute 6, as illustrated in FIG. 2. This permits the discs to roll under gravity along the surface of the abrasive belt 4 and eventually drop into the container 7.

Figure 3:
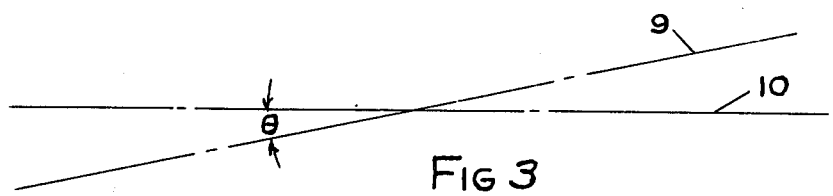
FIG. 3 is a graphical illustration showing the relative directions of motion of the abrasive belt utilized in the inventive process and the rotating ceramic discs.

In order to control the amount of material removed from the edge surface of the discs, the longitudinal axis 9 of the moving abrasive belt 4 is inclined by the angle $\theta$ with the longitudinal axis 10 of the guide slot 2, as illustrated in the schematic view of FIG. 3. The greater the angle $\theta$, the greater will be the right angle component of the velocity of the abrasive belt with respect to the plane surfaces of the rolling ceramic discs, and the greater will be the amount of material removed from the periphery of the discs. The speed of the belt and the angle of inclination of the abrasive surface of the belt 4 will also control the amount of edge surface material which is removed from the disc as it travels the length of the table from the chute 6 to the container 7. Thus, it is easily possible to adjust the system variables, including the slope of the belt 4, the angle $\theta$ between the axes of motion of the abrasive belt and the rolling ceramic discs, the speed of the belt, and the type of abrasive material on the belt to remove the exact amount of edge material necessary to clean the edges of the discs during the passage of the discs from the chute 6 to the container 7, thus accomplishing the primary object of the invention.

The use of the inventive process permits the economical manufacture of small-size thin ceramic discs by making it unnecessary to apply electrode materials by prior art costly methods which require the masking or shielding of the edge of the disc during the application of the electrode material. The disclosed process is particularly advantageous for permitting the economical application of electrodes to ceramic discs which may now be chemically plated or coated over their entire surface and then the edges of the discs may be economically stripped of conducting material by the procedure disclosed in this application.

While a specific embodiment of the present invention has been shown and described, it should be understood that various modifications and alternative constructions may be made without departing from the true spirit and scope of this invention. Therefore, the appended claims are intended to cover all such equivalent alternative constructions that fall within their true spirit and scope.

I claim:

1. A process for applying electrically conducting surfaces to the opposite flat surfaces of a plurality of thin disc-shaped electroacoustic transducers which includes the following steps:
   (a) Coat the entire disc, including the edge, with a film of electrically conducting material,
   (b) Place the coated discs individually into a slot-like guide which holds the discs with their plane surface approximately at right angles to the moving surface of an abrasive belt which is located to serve as a bottom for said slot-like guide,
   (c) Provide means for causing the discs to roll along the slot-like guide,
   (d) Provide alignment means for the slot-like guide which controls the direction of the rolling discs, such that the direction of motion of the rolling discs is skewed with relation to the direction of motion of the abrasive surface,
   (e) Adjust the skew angle between the direction of motion of the rolling discs and the direction of motion of the abrasive belt such that the film of electrically conducting material is completely removed from the edges of the discs as they roll along the slot-like guide.

2. The invention described in claim 1 characterized in that step (c) includes means for inclining the moving surface of the abrasive belt which serves as a bottom for said slot-like guide, whereby the ceramics roll along the inclined surface of the abrasive belt under the influence of gravity.

3. The invention in claim 1 characterized in that the film coating of electrically conducting material described in step (a) is a plated metal.

4. The invention in claim 3 further characterized in that said plated metal is nickel.

5. The invention in claim 3 further characterized in that said plated metal is electroless nickel.